(12) United States Patent
Sundararajan et al.

(10) Patent No.: US 8,875,073 B1
(45) Date of Patent: Oct. 28, 2014

(54) GENERATION OF INTERNAL INTERFACES FOR A BLOCK-BASED DESIGN

(71) Applicant: Xilinx, Inc., San Jose, CA (US)

(72) Inventors: Arvind Sundararajan, San Jose, CA (US); Jinsong Du, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/185,832

(22) Filed: Feb. 20, 2014

(51) Int. Cl.
  *G06F 17/50* (2006.01)
  *G06F 9/455* (2006.01)
(52) U.S. Cl.
  CPC .................................. *G06F 17/5031* (2013.01)
  USPC ......................................... 716/104; 716/128
(58) Field of Classification Search
  USPC ................................................. 716/104, 128
  See application file for complete search history.

(56) References Cited

U.S. PATENT DOCUMENTS

| 7,669,164 B1 * | 2/2010 | Ma et al. ......................... 716/138 |
| 7,870,522 B1 * | 1/2011 | Kelly et al. ..................... 716/136 |
| 8,146,027 B1 * | 3/2012 | Lindop et al. .................. 716/102 |
| 8,607,181 B1 * | 12/2013 | Mavroidis ....................... 716/116 |
| 2002/0166098 A1 * | 11/2002 | Chang et al. ....................... 716/1 |
| 2013/0305205 A1 * | 11/2013 | Kelem ............................ 716/126 |

\* cited by examiner

*Primary Examiner* — Suresh Memula
(74) *Attorney, Agent, or Firm* — W. Eric Webostad; David Parandoosh

(57) ABSTRACT

A method relating generally to computer aided design is disclosed. In such method, a block-based model of a hardware realizable system is obtained. An internal gateway-in and an internal gateway-out of a module of the block-based model are identified. An interface protocol is assigned for the internal gateway-in and the internal gateway-out. Data type and data propagation for the module at the internal gateway-in and the internal gateway-out are analyzed. The internal gateway-in and the gateway-out are transformed into an input/output interface. Integrated code is generated for subsequent realization of the input/output interface in hardware.

20 Claims, 5 Drawing Sheets

GENERATION OF INTERNAL INTERFACES FOR A BLOCK-BASED DESIGN

FIELD OF THE INVENTION

The following description relates to integrated circuit devices ("ICs"). More particularly, the following description relates to generation of internal interfaces for a block-based design for an IC.

BACKGROUND

A designer conventionally generates a model of a hardware system. This model may be in the form of a block diagram. This block diagram may have many modules, where one module communicates with another module through data. For example, a first module may receive data, process such data, and send such processed data to another module. Accordingly, within such a model there may be many modules, many blocks within modules, and these blocks may include internal data interfaces for communicating or moving data from one module to another. These internal interfaces may be distinguished from external interfaces, such as for example standardized interfaces for which raw data may be input to and processed data may be output from such model. For example, a model of a hardware system may be written for prototyping for example in a High-Level Modeling System ("HLMS") or High-Level Synthesis ("HLS") tool for subsequent synthesis to a production design. A designer working with an HLMS or HLS tool, or directly writing a code for such a model in a Hardware Description Language ("HDL") (e.g., VHDL or Verilog), a Register Transfer Language ("RTL"), or C-to-gates code (e.g., C-to-HDL or C-to-RTL), heretofore would construct these internal data interfaces between modules, which was a time consuming process.

Accordingly, it would be desirable and useful to further automate design of a hardware system by reducing the amount of effort in generating internal data interfaces therefor.

SUMMARY

A method relates generally to computer aided design. In such method, a block-based model of a hardware realizable system is obtained. An internal gateway-in and an internal gateway-out of a module of the block-based model are identified. An interface protocol is assigned for the internal gateway-in and the internal gateway-out. Data type and data propagation for the module at the internal gateway-in and the internal gateway-out are analyzed. The internal gateway-in and the gateway-out are transformed into an input/output interface. Integrated code is generated for subsequent realization of the input/output interface in hardware.

An apparatus relates generally to computer aided design. In such apparatus, there are: means for identifying an internal gateway-in and an internal gateway-out of a module of a block-based model, where the block-based model is of a hardware realizable system; means for assigning an interface protocol for the internal gateway-in and the internal gateway-out; means for analyzing data type and data propagation for the module at the internal gateway-in and the internal gateway-out; means for transforming the internal gateway-in and the internal gateway-out into an input/output interface; and means for generating integrated code for subsequent realization of the input/output interface in hardware.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

DETAILED DESCRIPTION

Figure 1:
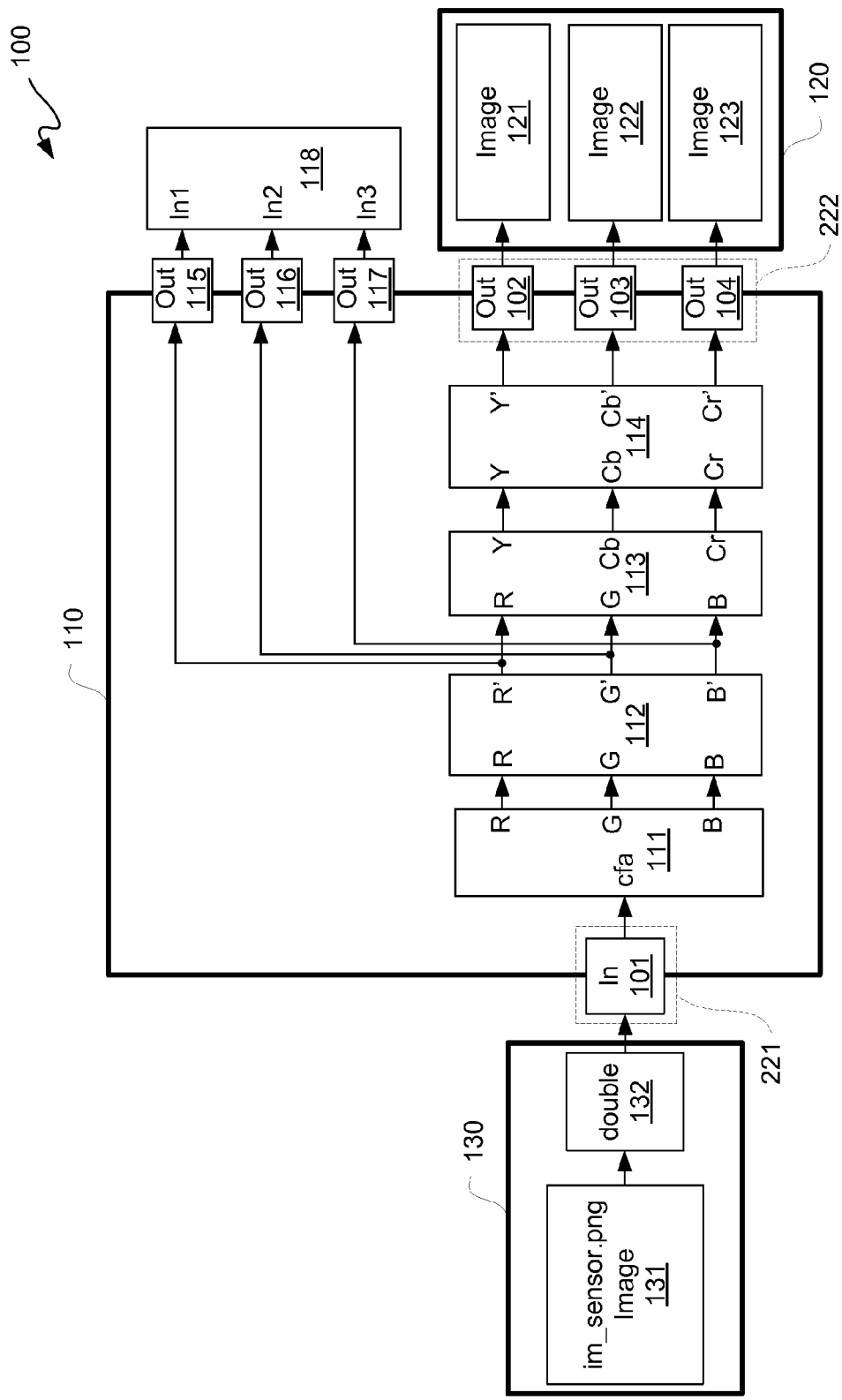
FIG. 1 is a block diagram depicting an exemplary model generated with an HLMS tool.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

As previously described, a model of a hardware system may be written for prototyping with a computer aided design program, for example in a High-Level Modeling System ("HLMS") or High-Level Synthesis ("HLS") tool for subsequent synthesis to a production design. A designer working with an HLMS or HLS tool, or directly writing a code for such a model in a Hardware Description Language ("HDL") (e.g., VHDL or Verilog), a Register Transfer Language ("RTL"), ANSI C/C++/SystemC code, or C-to-gates code (e.g., C-to-HDL or C-to-RTL), may produce a module, sometimes referred to as an "IP", and then synthesize such module using a logic or hardware synthesis tool, sometimes referred to as an integrator. In the example below, System Generator for DSP and System Generator DSP tools from Xilinx, Inc. of San Jose, Calif. ("Xilinx"), are described for an implementation in a Field Programmable Gate Array ("FPGA") having busing supporting an AXI protocol, in particular a video streaming portion of the AXI protocol, namely an AXI stream protocol. Additional details regarding these tools may be found in "System Generator for DSP User Guide" from Xilinx, UG640 (v 14.3), Oct. 16, 2013?, and "Vivado Design Suite User Guide Design Flows Overview" from Xilinx, UG892 (v2013.3), Oct. 2, 2013, among other publications from Xilinx. However, the following description is not limited to these particular tools, as generally any compatible system-level modeling tool and hardware synthesizer tool may be used. Furthermore, the following description is not limited to an FPGA implementation, as generally any form of hardware realization may be used, namely any form of VLSI of a modular hardware system having internal data interfaces.

AXI stream protocol is focused on transfer of streaming data; however, such protocol packetizes or otherwise envelopes such data for controlling such transfer, where such packetizing is independent of specificities of a data domain. For example, suppose the data is 24-bit RGB video data, and such data domain specificity is as follows: the first 8-bits represent red, the second 8-bits represent green, and the third 8-bits represent blue. An AXI stream protocol may packetize the data in 24-bit increments without any knowledge of the domain specificity of such data. The following description is not limited to bussing supporting an AXI stream protocol or any AXI protocol for that matter, as any bussing protocol that envelopes data may be used provided, however, that it supports data flow from one module to another module through an internal data interface of a modular hardware system.

In the following description, generation of internal data interfaces is substantially automated, if not fully automated using default settings, by a hardware synthesizer tool configured to generate such internal data interfaces from a model of a hardware system. This avoids having to have a designer design, as part of such model, these internal data interfaces. Along those lines, a designer need not have expert knowledge of a bus protocol, along with knowledge of internal workings of a hardware synthesis tool, in order to design such internal data interfaces. Rather, this knowledge is built into a hardware synthesis tool, which allows for a more expeditious prototyping process.

Generally, for a large system, a model may be created which is a compilation of multiple designers or teams of designers, whether at a same company or different companies. These designers may use same or different design methodologies. Using a video domain example, there may be an image sensor team and an I/O processing team. For this example, the image sensor team may be concerned about how image data may be captured and quality of captured pixels. However, the I/O team may be concerned about: how much raw image data is to be provided; how information is to be extracted from such captured raw image data; and how such data is to be processed. This is just one example to indicate how different designers may perceive data differently in designing a hardware realizable system. Accordingly, in designing a hardware system, there may be many experts spanning different disciplines for generating multiple models and/or modules, and these models and/or modules may have to communicate with one another internally within such hardware system. Along those lines, the ability to at least substantially automatically create data interfaces from such individual models and/or modules for data communication therebetween may substantially ease the burden of designing for such communication and may facilitate modularity of design by designers. With respect to the latter, designers may not need to have expertise with an internal data communication interface, such as may be associated with a bus protocol.

With the above general understanding borne in mind, various configurations for an internal interface generator for a hardware synthesis tool are generally described below.

FIG. 1 is a block diagram depicting an exemplary model 100 generated with an HLMS tool. Again for purposes of clarity by way of example and not limitation, model 100 is of an imaging pipeline; however, any model of a hardware system having internal data interfaces may be used. So even though specific details regarding this exemplary imaging pipeline are described below for purposes of clarity by way of example, it should be understood that model 100, and thus modules thereof, may be representative of any hardware system having internal data interfaces.

Model 100 includes modules 110, 120 and 130. Of course, a model 100 may have fewer or more than three modules in other examples. In this example, module 130 receives an image from a file, which in this example is an im_sensor.png image 131. Module 130 provides image 131 to a data type converter of module 130, which in this example is double precision data converter ("double") 132. Converter 132 provides such converted data to module 110.

Module 110 processes such converted data, and provides processed data as three separate data streams to module 120. In this example, module 120 receives images 121 through 123 for a video viewer (not shown) of such module 120. Additionally, in this example, module 110 partially processes such converted data, and provides such partially processed data to an external subsystem 118. In this example, such external subsystem has three lanes ("In"), namely lanes 1 through 3, for receiving three separate streams of data from module 110.

Module 110 receives data, such as image sensor data, from input block 101 to a color filter array ("cfa") port of a demosaicing block 111 of module 110. Module 110 in this example further includes a gamma correction block 112, an RGB to YCbCr color conversion block 113, and a 3×3 filter block 114. Demosaicing block 111 reconstructs an RGB color image from image sensor data receiver and provides a red data stream (R), a green data stream (G), and a blue data stream (B) to gamma correction block 112. Demosaicing block 111 may have a number of register delay stages that contribute to overall latency of module 110. For purposes of clarity by way of example and not limitation, it shall be assumed that demosaicing block 111 has 961 register delay stages, or $z^{-961}$; however, in other examples, this or another number of register delay stages may be used.

Gamma correction block 112 encodes and decodes luminance values in each of a received red data stream, green data stream, and blue data stream to correspondingly provide a gamma adjusted red data stream (R'), a gamma adjusted green data stream (G'), and a gamma adjusted blue data stream (B'). In this example, these three gamma adjusted color streams are respectively provided to R, G, and B ports of color conversion block 113 and are respectively provided to external output ports 115 through 117. External output ports 115 through 117 couple module 110 to subsystem 118. In this example, gamma correction block 112 has a single register delay stage; however, in other examples, this or another amount of register delay stages may be used for gamma correction.

Color conversion block 113 respectively converts received R, G, and B data streams to a brightness or luma data stream (Y), a blue minus luma data stream (Cb), and a red minus luma data stream (Cr) for respective output to 3×3 filter block 114. In this example, color conversion block 113 has eleven register delay stages of one; however, in other examples, this or another amount of register delay stages may be used for color conversion. Filter block 114 filters receives Y, Cb, and Cr data streams to provide corresponding filtered Y, Cb, and Cr data streams. For purposes of clarity by way of example and not limitation, it shall be assumed that filter block 114 has 961 register delay stages, or $z^{-961}$; however, in other examples, this or another number of register delay stages may be used. Filtered Y, Cb, and Cr data streams are respectively provided from filter block 114 to output blocks 102 through 104.

Figure 2:
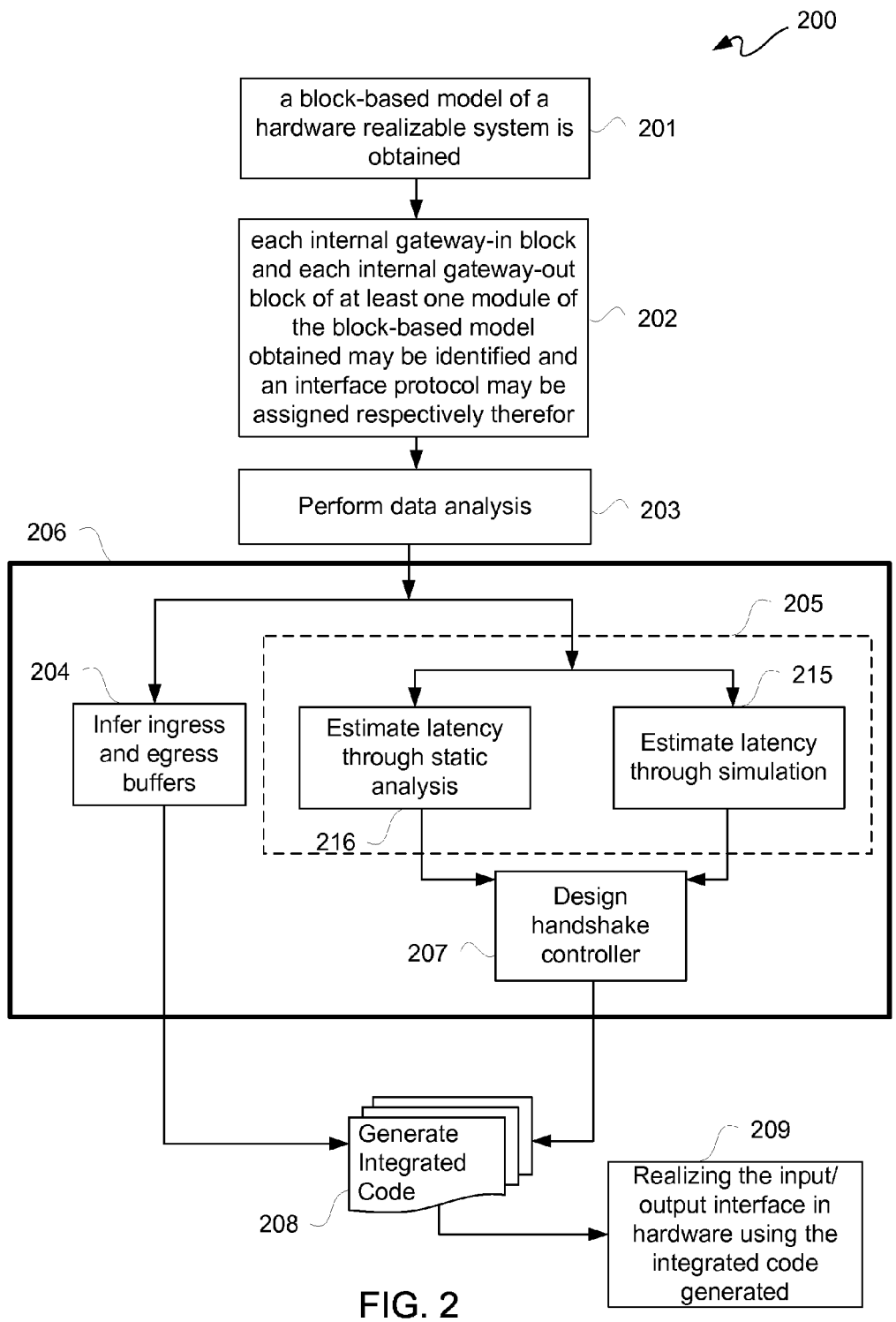
FIG. 2 is flow diagram depicting an exemplary internal data interface generation flow for an internal interface generator.

FIG. 2 is flow diagram depicting an exemplary internal data interface generation flow 200 for an internal interface generator. FIG. 2 is further described with simultaneous reference to FIG. 1.

At 201, a block-based model of a hardware realizable system is obtained. Such model may be input or otherwise obtained by a hardware synthesis tool in which internal data interface generation flow 200 is included as an internal interface generator. In another configuration, internal data interface generation flow 200 may be provided as a stand-alone software internal interface generator product that generates code, which may be provided in or with a model input. However, for purposes of clarity by way of example and not limitation, it shall be assumed that internal data interface generation flow 200 is part of a hardware synthesis tool which is executed on a computer. In this example, it is assumed that internal data interface generation flow 200 is of an internal interface generator program product, such as may be included in System Generator DSP; however, another hardware synthesis tool may be used.

Model 100 is an example of such a block-based model that may be used; however, as previously indicated other models may likewise be used. In this example, model 100 is a design created in System Generator for DSP; however, a model may be created in another HLMS tool, as previously described.

At 202, each internal gateway-in block and each internal gateway-out block of at least one module of the block-based model obtained at 201 may be automatically identified. As described below in additional detail, information in terms of respective contexts of such gateways may be used to generate corresponding internal data interfaces. Along those lines, by automatic, automatically, and variations thereof, it is generally meant that such operation or operations may be executed by a programmed computer without having to have a user intervene in execution of such operation or operations, including without limitation inputting data for such execution.

Based on contexts of such gateways identified, one or more bus communication protocols may be automatically selected from a set of bus communication protocols, such as AXI-Stream, AXI-Lite, and/or AXI-Memory Map, or other bus protocols for example. From a design context, it may be determined that streaming of video data is being performed, and accordingly a data internal interface generator tool may automatically select a bus streaming protocol based on such design context.

In another configuration, at 202 a user may select which protocols are respectively to be used for each of the identified gateways. Thus, for example, at 202, a user may select an AXI-Lite protocol if control data is being communicated through a first internal data interface, and a user may select an AXI Memory Map protocol if data from memory is being communicated through a second internal data interface.

In yet another configuration, data domain context for each identified gateway may be provided for user selection, along with a suggested protocol to use based on such identified context from a module. For purposes of clarity by way of example and not limitation, it shall be assumed that an internal interface generator automatically selects a bus protocol to use for each internal gateway identified responsive to design context of each such internal gateway.

In the example of module 110, there is one gateway-in and six gateway-outs, namely input block 101 and output blocks 102 through 104 and 115 through 117. However, output blocks 115 through 117 are of an external data interface, and so such output blocks may be ignored at 202. Thus, at 202 for the example of module 110, input block 101 may be identified as an internal data gateway-in block, as generally indicated by dashed box 221, and output blocks 102 through 104 may be identified as an internal data gateway-out block, as generally indicated by dashed box 222. Moreover, at 202, design or data domain contexts for gateways 221 and 222 may all be identified as being for streaming data, in particular streaming video data, and an AXI-Stream protocol may be selected and assigned for association with each of such gateways by an internal interface generator at 202.

At 203, data analysis may be automatically performed for data propagation and data type for data domains at gateways identified at 202. One aspect of data analysis may be determining data propagation or configuration. Continuing the above example of video data, data may be provided in frames, such as 1920×1080 progressive frames for example for a high-definition progressive scan format or some other format. Thus, data propagation may indicate signal dimensions on a gateway, such as indicated by a 1920×1080 video frame for example. Along those lines, even though a bus communication protocol for streaming has been assigned, determining a data propagation may be used for determining buffer size, such as data input width, data output width, and depth of a buffer entry for example. Such a buffer may be used for an internal data interface to be constructed, as described below in additional detail. Determining data propagation may provide an indication of how fast data is arriving or being sent, which may provide an indication of how fast to clock such a buffer and may provide an indication of how deep to construct such a buffer.

Data type may provide an indication of how data is to be handled. For example, suppose data propagation for two different data types is the same. In this example, assume the first data type is for correlated data, such as video data as indicated above, for which there may be a correlation between frames of data, and assume the second data type is uncorrelated data, such as data read from memory. For mapping video data to a domain, knowledge regarding when a frame has reached its end and a next frame begins may be understood from data type, and this information may be used by a data processing kernel in a module, such as for propagation of a "$t_{last}$" signal for example in an AXI-Stream protocol. Along those lines, if a "$t_{last}$" signal is missing from a frame, a constructed internal data interface configured to look for such "$t_{last}$" signal being marked or asserted after a specified number of samples or data volume may assert an error signal. However, if a data type is for uncorrelated data read from memory, there may not be a "$t_{last}$" signal (e.g., such data may not be a matrix of correlated data though read out as a matrix or "page"), and so an internal data interface may not be constructed to look for or may be configured to ignore such a "$t_{last}$" signal. Thus, data type may provide control information for controlling operation of a buffer, such as when to input and/or output information from a buffer, and thus when to transition and/or toggle a control signal for such a buffer.

Data information from data propagation and data type, as well as a bus protocol, may provide interface information for construction of an internal data interface at 206. In other words, internal gateways identified at 202 may be transformed into an input/output interface at 206. A transformation operation at 206 may include operations at 204, 205, and 207, for generation of code for such transformation at 208, namely for generation of code to synthesize such an input/output interface.

From data information obtained at 203, ingress and egress buffers for internal gateway-in and gateway-out blocks, respectively, may be automatically inferred at 204. Continuing the above example of an AXI-Stream protocol, it shall be assumed that such buffers are AXI buffers for purposes of clarity by way of example and not limitation, as buffers conforming to other protocols may likewise be inferred at 204. For example, gateway-in block 221 may be transformed into an input interface having an ingress buffer, and gateway-out block 222 may be transformed into an output interface having three egress buffers.

At the same time buffers are inferred at 204, a latency estimate may be automatically generated at 205. Such latency may be an estimate of latency of a module from input of data at an input interface to output of corresponding data at an output interface after being processed by a kernel of such a module. For example, latency may be estimated from a gateway-in block 221 to a gateway-out block 222 through a block-based model of module 110. At 205, latency may be estimated using a static analysis at 216 and/or a non-static analysis, such as by simulation of operation of a module 110, at 215.

A static latency estimate may be generated using a graph, as known. For example, an analysis of a data path may be performed from output of a data source for a module to output of such module using Djikstra's shortest path algorithm (i.e., ports form vertices and weights on corresponding edges indicate latency). In a HLMS design, each block may proffer a port-to-port latency, and so from this information it may be estimated when data coming out of a module will be valid. For an AXI-Stream implementation, a combination of counters and relational blocks can be used to generate a valid signal driving a valid port (i.e., a tvalid_in port) of AXI FIFO egress block.

Alternatively or additionally, a simulated estimate using signal tagging may be performed to estimate latency. In this type of simulation, in a cycle accurate simulator, data samples also carry a sideband signal called valid. This sideband signal is generally not translated into hardware; however, simulation models for each block in an HLMS may make a copy of a valid sideband sample to an output port based on behavior. For example, if a block is a two input adder, generally a simulation model will only make the output data sample's sideband valid signal 1 if both the input data sample's sideband signals are 1.

These or other examples of static or non-static latency estimation may be used. Additionally, a module may have a specified or estimated latency as provided by a designer or a modeling tool, and such latency may optionally be imported at 205 to provide a latency estimate. Accordingly, any or all of the above examples may be used to provide a latency or latency range.

Using either or both a static latency estimate or a simulated operation latency estimate input, as well as a bus protocol as previously described, at 207 a handshake controller may be automatically designed. Generally, such handshake controller may control operation of ingress and egress buffers inferred at 204 for a longer of such latency estimates. For example, for an AXI-Stream protocol a $t_{valid}$ signal is to be toggled when data is ready to be input to a module from an ingress buffer or input from a module to an egress buffer. This means an estimate of latency may be used to determine how much time or how many clock cycles it takes for data to be processed through a module from input to output. For a streaming application, generally data is being processed or generated on each clock cycle once a pipeline of a module is full. A smallest or shortest latency estimate is thus a minimum amount of time to be allotted before a $t_{valid}$ signal may be asserted on an output, and a largest or longest latency estimate is thus a maximum amount of time to be allotted after which assertion of a $t_{valid}$ signal may be problematic. According, a latency range may be established if such estimates are not equivalent.

At 208, code for a hardware realization, namely integrated code, may be automatically generated to provide any and all ingress and egress buffers inferred at 204, and any and all designed handshake controllers at 207 for such inferred buffers. This code may be used to amend or incorporate such buffers and controllers as part of a block-based model 100, and such integrated code for amending a block-based model 100 may be output at 208. For the above example, code generation at 208 may result in synthesis of: a structural netlist of a design under test ("DUT"), a FIFO ingress buffer block for an AXI-Stream protocol, a FIFO egress buffer block for an AXI-Stream protocol, and a control signal generator block for controlling data flow between such buffer blocks. For purposes of clarity by way of example and not limitation, a schematic of RTL generated from an HLMS design is provided in FIG. 3 for an AXI-Stream protocol. At 209, an input/output interface, such as described for example with reference to FIG. 3 below, may be realized in hardware using such integrated code generated at 208.

Figure 3:
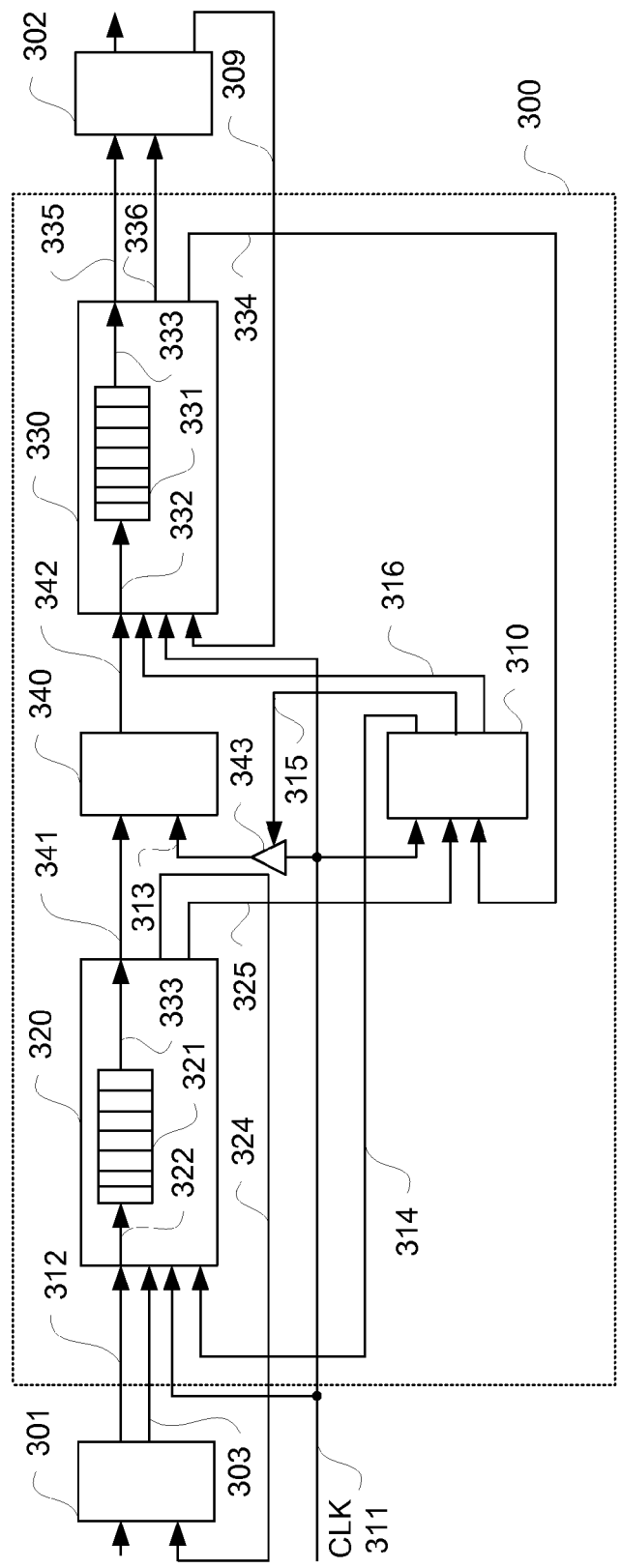
FIG. 3 is a schematic diagram depicting an exemplary input/output interface.

FIG. 3 is a schematic diagram depicting an exemplary input/output interface 300. Input/output interface 300 may be generated from integrated code, such as at 208 for example. As previously described, signal dimensions, as well as other signal information, may be used to translate HLMS to RTL in order to provide such integrated code.

Module 340, which is a DUT, may be a module of a model, such as previously described for example or other block-based design structure, and thus module 340 is not part of input/output interface 300. However, integrated code generated for input/output interface 300 may effectively couple input/output interface 300 to module 340. Likewise, integrated code generated for input/output interface 300 may effectively couple input/output interface 300 to a data source 301 and a data sink 302. In this example, data source 301 is an external source with respect to module 340, and data sink is an external sink with respect to module 340. Furthermore, data source 301 is a master with respect to ingress buffer 320.

Input/output interface 300 includes an ingress buffer 320 and an egress buffer 330, as well as a control signal generator 310. Control signal generator 310 may be thought of as a handshake controller, such as previously described. In this example, egress buffer 330 is a master with respect to data sink 302. In this example, input/output interface 300 further optionally includes a clock buffer 343 for buffering an input clock signal 311 to provide a buffered version thereof as clock signal 313 to module 340. In this example, a Field Programmable Gate Array ("FPGA") may be used with clock buffers. However, in other implementations, a clock buffer may not be present in input/output interface 300. Furthermore, this example is a continuation of the above video streaming example for purposes of clarity by way of example and not limitation, as other data flow, and control thereof, applications may be used in accordance with the description herein.

Clock signal 311, in addition to being provided to clock buffer 343, may be provided to buffers 320 and 330, as well as control signal generator 310. Ingress buffer 320 may provide a buffer empty control signal 325 to control signal generator 310, and egress buffer 330 may provide a buffer full control signal 334 to control signal generator 310. Control signal generator 310 may provide a read enable signal 314 to ingress buffer 320 as a global data flow control signal for input/output interface 300. Control signal generator 310 may provide a write enable signal 316 to egress buffer 330 as a global data flow control signal for input/output interface 300. Read enable signal 314 may be asserted for ingress buffer 320 by control signal generator 310 provided such buffer is not empty and provided that egress buffer is not full, as respectively known by status of control signals 325 and 334. Similarly, control signal generator 310 may assert a write enable signal 316 if data is available to be written.

Additionally, control signal generator 310 may provide a clock control signal 315 to clock buffer 343 to control clocking of module 340. Along those lines, if egress buffer 330 is full as indicated by buffer full control signal 334 or if ingress buffer 320 is empty as indicated by buffer empty control signal 325, control signal generator 310 may de-assert clock control signal 315 to cause module 340 to stop being clocked, namely to temporality freeze data processing by module 340. Clock control signal 315 may be asserted provided neither of control signals 325 or 334 is asserted.

Other control signals that may be used for an AXI-Stream protocol are a last signal (i.e., a "tlast" signal) and a user signal (i.e., a "tuser" signal). Though not shown for purposes of clarity, an ingress buffer 320 may be configured to check a tlast signal such that it toggles one for every frame of data, such as every 2,073,600 data samples in the above example of 1920×1080 frames. Similarly, a 1-bit tuser signal may be reserved to indicate a start of a line of a frame.

With respect to data flow, a data valid signal 303 may be asserted by data source 301 to inform ingress buffer 320 that there is data available. Ingress buffer 320 may thus assert a ready signal 324, when it is ready, to cause data source 301 to start transferring such available data for input to ingress buffer 320. Ingress buffer 320 may include a FIFO buffer 321 for writing data into such FIFO responsive to a write to buffer signal 322 and for reading data from such FIFO responsive to a read from buffer signal 333. Data out signal 341 may be used to provide data read from FIFO buffer 321 to module 340, and module 340 may process such input data to provide output data on data signal 342.

Data on data signal 342 may be received by egress buffer 330. Assuming write enable signal 316 is asserted, such received data may be written into a FIFO buffer 331 of egress buffer 330 responsive to assertion of a write to buffer signal 332. However, if buffer full signal 334 is asserted, enable write signal 316 may not be asserted.

Egress buffer 330 may provide a data valid signal 336 to data sink 302 to indicate that data is available to be read onto data signal 335. Data sink 302 may assert a ready signal 309 to egress buffer 330 to indicate data sink 302 is ready to receive such available data. In response to assertion of such ready signal, egress buffer 330 may assert a read from buffer signal 333 to read data from FIFO buffer 331 to provide data on data signal 335 for data sink 302.

As indicated FIFO buffers may be generated, and as indicated sizes for such buffers may be inferred. Along those lines, in an example design for FIG. 3, data source 301 may constantly send data at a data sample at rate of 1/m, which is one data sample at per every m clock cycles. Data sink 302 may consume a data sample at a faster rate of 1/n, which is one data sample at every n clock cycles. Data sink 302 may consume data in a burst of k clock cycles, and then data sink 302 may idle for p clock cycles, such that an average rate of samples consumed by a downstream slave block is the same average rate as samples produced by an upstream master block. Because the average rate for input and output of data samples is equal such that no samples are lost, a relationship for a send rate of data source 301 may be expressed as:

$$\frac{1}{m} = \frac{\frac{1}{n} * k}{k + p'}$$

where 1/n multiplied by k is a number of data samples consumed by data sink 302, and k plus p is a total clock cycles that data sink 302 used to consume data samples. From which, a data sink idle time p may be determined as follows:

$$p = \frac{m}{n} - 1 * k.$$

Along those lines, a minimal buffer for a design of an ingress and an egress buffer may be found according to:

$$\text{buffer size} = \frac{p}{m} = \frac{m}{n} - 1 * \frac{k}{m} = \frac{1}{n} - \frac{1}{m} * k.$$

If a designer provides a number of input clock cycles, k, for burst, or such information about a signal may be extracted from a model, a minimal buffer size may be determined. If user provides a buffer size or such buffer size may be extracted from a model, a maximum number of clock cycles in a burst (i.e., that can be supported) may be determined.

As long as there is one buffer between data source 301 and data sink 302, and such buffer has enough size, data transfer in a design may be smooth and reliably safe. However, each of ingress buffer 320 and egress buffer 320 may have at least one buffer of depth one in order to do handshaking with data source 301 and data sink 302, respectively. Depending on whether data width on an output bus or an input bus is wider, a deep FIFO may be placed in input side or output side of an input/output interface 300.

In the above example, a continuous stream of data, which may be defined by sample periods such as for frames, was generally described. Interfaces to a module may be high-speed data interfaces with low bandwidth control interfaces as described, or some other configuration as generally indicated. Furthermore, as high-level blocks may have cycle accurate latencies associated therewith, module latency may be verified and/or determined, as previously described. However, it should be appreciated that gateway-ins and gateway-outs may be transformed into corresponding ingress and egress interfaces without having to modify a structural netlist of a module design between such gateway-ins and gateway-outs. Effectively, integrated code generated for such transformation represents a separation of interface synthesis from an algorithmic synthesis of a module. Hence, a designer or designers do not have to modify a module design to synthesize different interfaces. Along those lines, because interface generation as described herein is modular, verification of such interface generated may be separate from verification of a DUT having such interface coupled to it. Even though the above description was in terms of generating AXI4-Stream interfaces for a System Generator for DSP created design, it should again be understood that other types of interfaces and/or hardware synthesizers may be used.

Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 4:
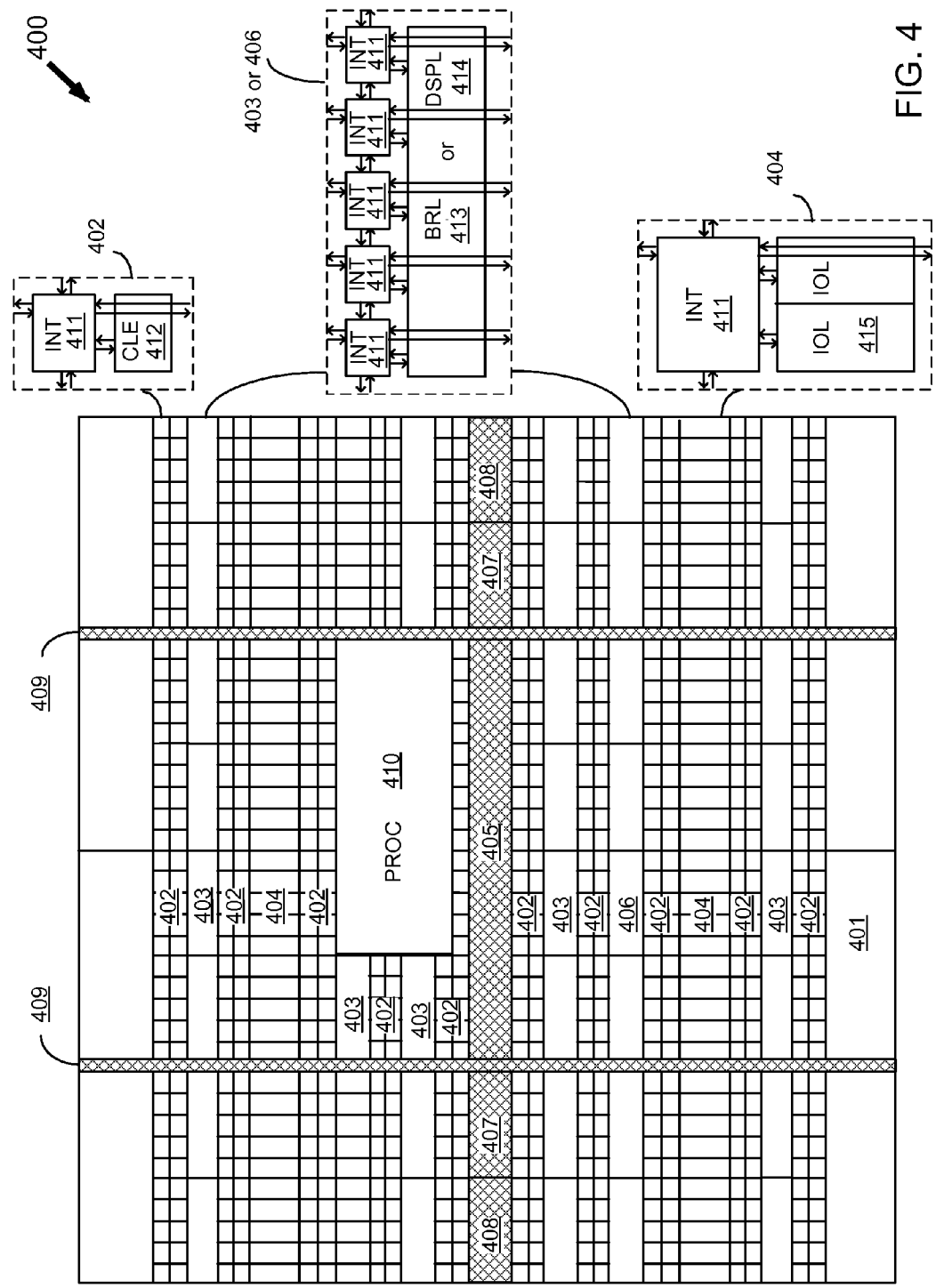
FIG. 4 is a simplified block diagram depicting an exemplary columnar Field Programmable Gate Array ("FPGA") architecture.

As noted above, advanced FPGAs can include several different types of programmable logic blocks in the array. For example, FIG. 4 illustrates an FPGA architecture 400 that includes a large number of different programmable tiles including multi-gigabit transceivers ("MGTs") 401, configurable logic blocks ("CLBs") 402, random access memory blocks ("BRAMs") 403, input/output blocks ("IOBs") 404, configuration and clocking logic ("CONFIG/CLOCKS") 405, digital signal processing blocks ("DSPs") 406, specialized input/output blocks ("I/O") 407 (e.g., configuration ports and clock ports), and other programmable logic 408 such as digital clock managers, analog-to-digital converters, system monitoring logic, and so forth. Some FPGAs also include dedicated processor blocks ("PROC") 410.

In some FPGAs, each programmable tile includes a programmable interconnect element ("INT") 411 having standardized connections to and from a corresponding interconnect element in each adjacent tile. Therefore, the programmable interconnect elements taken together implement the programmable interconnect structure for the illustrated FPGA. The programmable interconnect element 411 also includes the connections to and from the programmable logic element within the same tile, as shown by the examples included at the top of FIG. 4.

For example, a CLB 402 can include a configurable logic element ("CLE") 412 that can be programmed to implement user logic plus a single programmable interconnect element ("INT") 411. A BRAM 403 can include a BRAM logic element ("BRL") 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element ("DSPL") 414 in addition to an appropriate number of programmable interconnect elements. An IOB 404 can include, for example, two instances of an input/output logic element ("IOL") 415 in addition to one instance of the programmable interconnect element 411. As will be clear to those of skill in the art, the actual I/O pads connected, for example, to the I/O logic element 415 typically are not confined to the area of the input/output logic element 415.

In the pictured embodiment, a horizontal area near the center of the die (shown in FIG. 4) is used for configuration, clock, and other control logic. Vertical columns 409 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 410 spans several columns of CLBs and BRAMs.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 5:
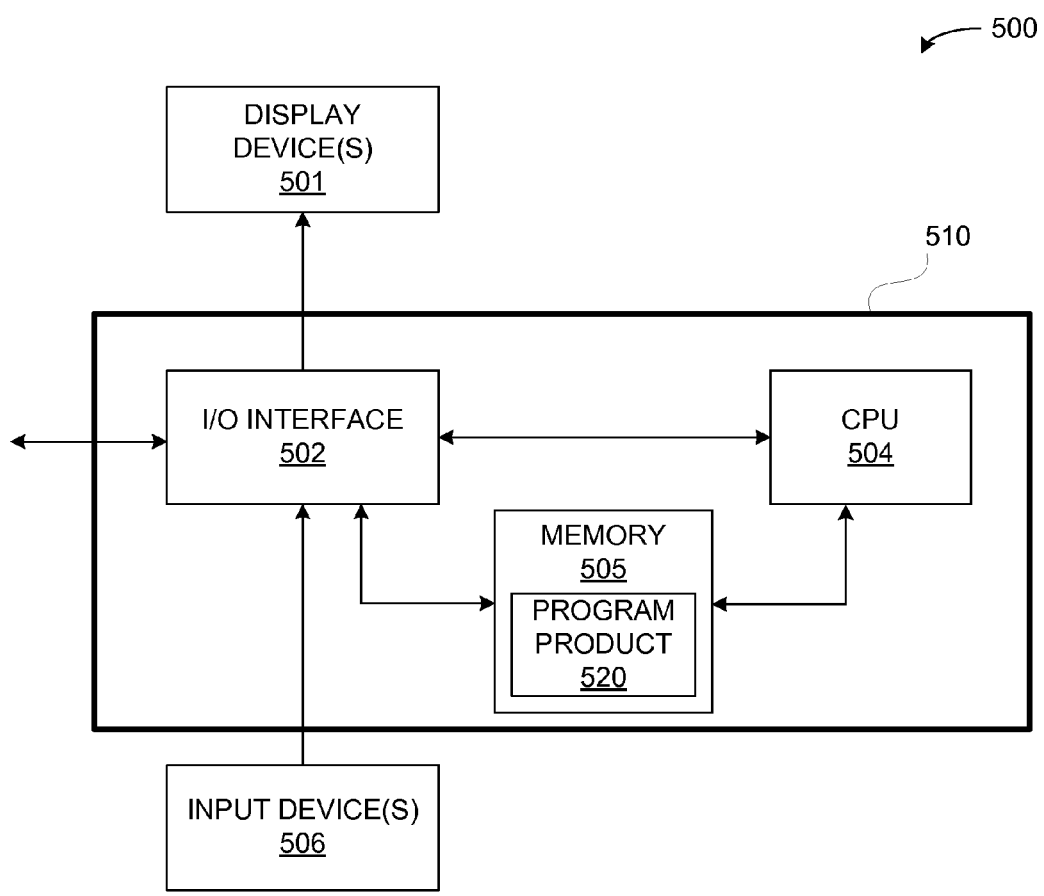
FIG. 5 is a block diagram depicting an exemplary information handling computer system.

FIG. 5 is a block diagram depicting an exemplary computer system 500. Computer system 500 may include a programmed computer 510 coupled to one or more display devices 501, such as Cathode Ray Tube ("CRT") displays, plasma displays, Liquid Crystal Displays ("LCD"), projectors and to one or more input devices 506, such as a keyboard and a cursor pointing device. Other known configurations of a computer system may be used. Computer system 500 by itself or networked with one or more other computer systems 500 may provide an information handling system.

Programmed computer 510 may be programmed with a known operating system, which may be Mac OS, Java Virtual Machine, Real-Time OS Linux, Solaris, iOS, Android Linux-based OS, Unix, or a Windows operating system, among other known platforms. Programmed computer 510 includes a central processing unit (CPU) 504, memory 505, and an input/output ("I/O") interface 502. CPU 504 may be a type of microprocessor known in the art, such as available from IBM, Intel, ARM, and Advanced Micro Devices for example. Support circuits (not shown) may include cache, power supplies, clock circuits, data registers, and the like. Memory 505 may be directly coupled to CPU 504 or coupled through I/O interface 502. At least a portion of an operating system may be disposed in memory 505. Memory 505 may include one or more of the following: flash memory, random access memory, read only memory, magneto-resistive read/write memory, optical read/write memory, cache memory, magnetic read/write memory, and the like, as well as non-transitory signal-bearing media as described below.

I/O interface 502 may include chip set chips, graphics processors, and/or daughter cards, among other known circuits. An example of a daughter card may include a network interface card ("NIC"), a display interface card, a modem card, and a Universal Serial Bus ("USB") interface card, among other known circuits. Thus, I/O interface 502 may be coupled to a conventional keyboard, network, mouse, display printer, and interface circuitry adapted to receive and transmit data, such as data files and the like. Programmed computer 510 may be coupled to a number of client computers, server computers, or any combination thereof via a conventional network infrastructure, such as a company's Intranet and/or the Internet, for example, allowing distributed use for interface generation.

Memory 505 may store all or portions of one or more programs or data to implement processes in accordance with one or more embodiments hereof to provide an internal interface generator program product 520 along the lines describe herein. Additionally, those skilled in the art will appreciate that one or more embodiments hereof may be implemented in hardware, software, or a combination of hardware and software. Such implementations may include a number of processors or processor cores independently executing various programs and dedicated hardware or programmable hardware.

One or more program(s) of program product 520, as well as documents thereof, may define functions of embodiments hereof and can be contained on a variety of non-transitory signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); or (ii) alterable information stored on writable storage media (e.g., floppy disks within a diskette drive or flash drive or hard-disk drive or read/writable CD or read/writable DVD). The above embodiments specifically include information downloaded from the Internet and other networks. Such non-transitory signal-bearing media, when carrying computer-readable instructions that direct functions hereof, represent embodiments hereof.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A method for computer aided design, the method comprising:
    obtaining a block-based model of a hardware realizable system;
    identifying an internal gateway-in and an internal gateway-out of a module of the block-based model;
    assigning an interface protocol for the internal gateway-in and the internal gateway-out;
    analyzing data type and data propagation for the module at the internal gateway-in and the internal gateway-out;
    transforming the internal gateway-in and the gateway-out into an input/output interface; and
    generating integrated code for subsequent realization of the input/output interface in hardware.

2. The method according to claim 1, wherein the transforming and the generating are performed automatically by a programmed computer.

3. The method according to claim 2, wherein the analyzing is performed automatically by the programmed computer.

4. The method according to claim 2, wherein the assigning is performed automatically by the programmed computer.

5. The method according to claim 2, wherein the identifying is performed automatically by the programmed computer.

6. The method according to claim 1, wherein the transforming comprises:
    determining data information from data type and data propagation for the internal gateway-in and the internal gateway-out;
    inferring an ingress buffer and an egress buffer based on the data information determined;
    obtaining a latency from the internal gateway-in to the internal gateway-out through the module; and
    designing a handshake controller for controlling operation of the ingress buffer and the egress buffer for the latency estimated.

7. The method according to claim 6, wherein the latency is obtained from a static analysis of the module.

8. The method according to claim 6, wherein the latency is obtained from a simulation of the module.

9. The method according to claim 6, wherein the integrated code generated is a synthesis of the ingress buffer, the egress buffer, and the handshake controller.

10. The method according to claim 7, wherein the handshake controller is coupled to the ingress buffer and the egress buffer.

11. The method according to claim 6, wherein the integrated code generated is a synthesis of the module, the ingress buffer, the egress buffer, and the handshake controller.

12. The method according to claim 6, wherein the interface protocol is for either a control bus, a memory bus, or a streaming bus.

13. The method according to claim 1, wherein the input/output interface is provided without having to modify a structural netlist of the block-based model between the internal gateway-in and the internal gateway-out.

14. A computer program product, comprising a non-transitory computer readable medium having computer program code embodied therein, said computer readable program code to implement a method for computer aided design when executed by a processor, the method comprising:
    obtaining a block-based model of a hardware realizable system;
    identifying an internal gateway-in and an internal gateway-out of a module of the block-based model;
    assigning an interface protocol for the internal gateway-in and the internal gateway-out;
    analyzing data type and data propagation for the module at the internal gateway-in and the internal gateway-out;
    transforming the internal gateway-in and the gateway-out into an input/output interface; and
    generating integrated code for subsequent realization of the input/output interface in hardware.

15. An apparatus for computer aided design, comprising:
    means for identifying an internal gateway-in and an internal gateway-out of a module of a block-based model;

wherein the block-based model is of a hardware realizable system;

means for assigning an interface protocol for the internal gateway-in and the internal gateway-out;

means for analyzing data type and data propagation for the module at the internal gateway-in and the internal gateway-out;

means for transforming the internal gateway-in and the internal gateway-out into an input/output interface; and means for generating integrated code for subsequent realization of the input/output interface in hardware.

16. The apparatus according to claim 15, wherein the means for transforming is configured to:

determine data information from data type and data propagation for the internal gateway-in and the internal gateway-out;

infer an ingress buffer and an egress buffer based on the data information determined;

obtain a latency from the internal gateway-in to the internal gateway-out through the module; and design a handshake controller for controlling operation of the ingress buffer and the egress buffer for the latency estimated.

17. The apparatus according to claim 16, wherein the means for transforming is configured to perform a static analysis of the module to obtain the latency.

18. The apparatus according to claim 16, wherein the means for transforming is configured to perform a simulation of the module to obtain the latency.

19. The apparatus according to claim 16, wherein the integrated code generated is a synthesis of the ingress buffer, the egress buffer, and the handshake controller.

20. The apparatus according to claim 16, wherein the integrated code generated is a synthesis of the module, the ingress buffer, the egress buffer, and the handshake controller.

* * * * *